Jan. 14, 1964 J. S. WAPNER ETAL 3,117,719

ANALOG TO DIGITAL CONVERTER AND RECORDER

Filed April 29, 1959 6 Sheets-Sheet 1

INVENTORS
JOSEPH S. WAPNER &
DANIEL J. MEIKLEJOHN
BY
Busser, Smith & Harding
ATTORNEYS

ANALOG TO DIGITAL CONVERTER AND RECORDER

Filed April 29, 1959 6 Sheets-Sheet 2

INVENTORS
JOSEPH S. WAPNER &
DANIEL J. MEIKLEJOHN
BY
Busser, Smith & Harding
ATTORNEYS

ANALOG TO DIGITAL CONVERTER AND RECORDER

Filed April 29, 1959 6 Sheets-Sheet 3

INVENTORS
JOSEPH S. WAPNER &
DANIEL J. MEIKLEJOHN
BY
Busser, Smith & Harding
ATTORNEYS Jan. 14, 1964 J. S. WAPNER ETAL 3,117,719

ANALOG TO DIGITAL CONVERTER AND RECORDER

Filed April 29, 1959 6 Sheets-Sheet 4

INVENTORS
JOSEPH S. WAPNER &
DANIEL J. MEIKLEJOHN

BY [signature]
ATTORNEYS

ANALOG TO DIGITAL CONVERTER AND RECORDER

INVENTORS
JOSEPH S. WAPNER &
DANIEL J. MEIKLEJOHN
BY
Busser, Smith & Harding
ATTORNEYS INVENTORS
JOSEPH S. WAPNER &
DANIEL J. MEIKLEJOHN
BY
Busser, Smith & Harding
ATTORNEYS United States Patent Office 3,117,719

Patented Jan. 14, 1964

3,117,719

ANALOG TO DIGITAL CONVERTER AND RECORDER

Joseph S. Wapner, Levittown, and Daniel J. Meiklejohn, Philadelphia, Pa., assignors to Fischer & Porter Company, Hatboro, Pa., a corporation of Pennsylvania Filed Apr. 29, 1959, Ser. No. 809,832
5 Claims. (Cl. 235—58)

This invention relates to an analog to digital converter and recorder which receives a continuous input, and converts such input into a digital code, providing a record and, if desired, a digital electrical output.

In accordance with the present invention a variable input is applied to a shaft which is very freely rotatable so that the input is required to provide extremely low power. In the form of the invention specifically described hereafter the input shaft drives a pair of encoding elements at a 100:1 ratio, and it is possible to provide discrete digital signals through a range of ten-thousand units. Because of the relatively slow advance of the higher order unit there would be ordinarily the possibility of considerable ambiguity as to the correct reading of the higher order. In accordance with the present invention this ambiguity is resolved through the use of a differential drive. It will become evident that the arrangement thus provided is indefinitely extendable if desired.

The converter is constructed to provide a digitally coded punched tape which may be used as an input to a computer, printing recorder, or the like. Furthermore, in accordance with the invention, there is operated an arrangement of electrical contacts so that there may be provided an electrical output for telemetering purposes.

The device which is provided is simple and reliable in construction, and may be operated from a battery with low drain thereon so that it may be located at remote places where it will operate without attention over long periods of time.

The general objects of the invention are concerned with the attainment of the foregoing objectives, and these and other objects will become clear from the following description, read in conjunction with the accompanying drawings, in which.

Figure 1:
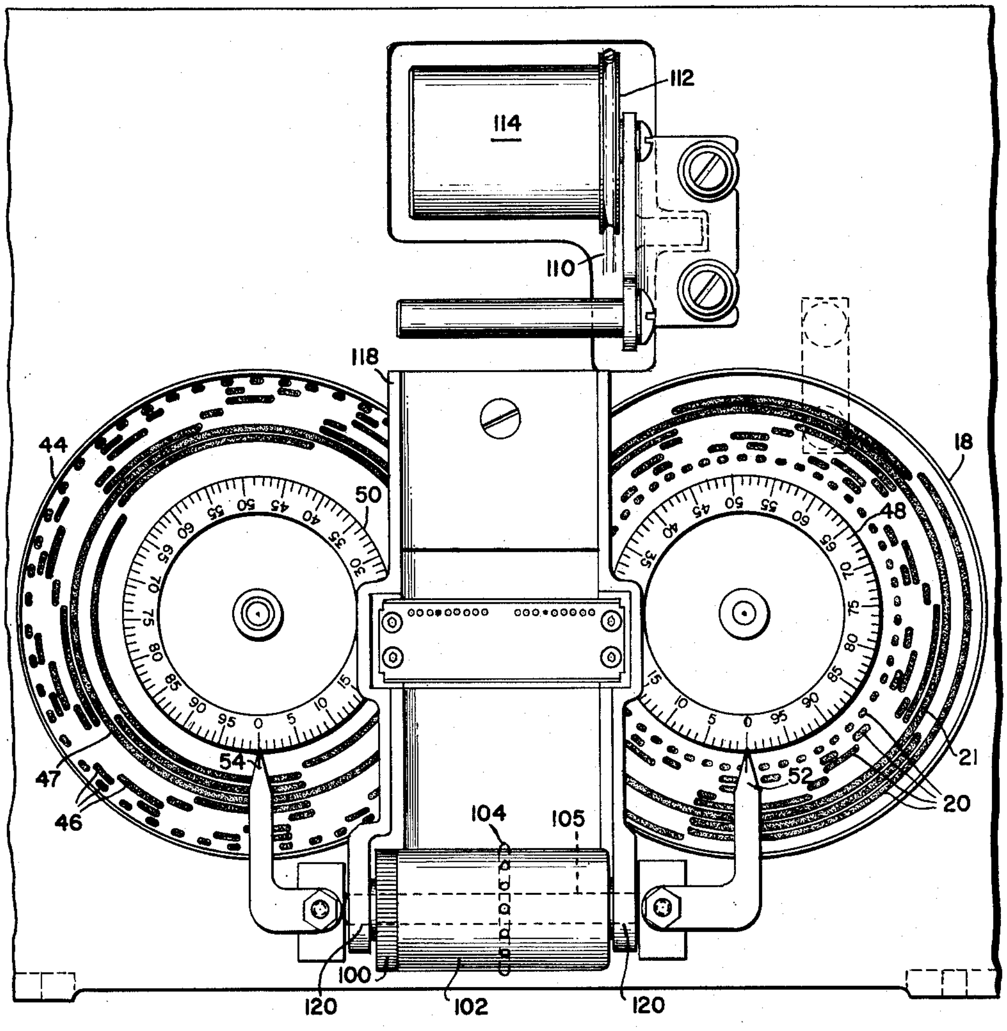
FIGURE 1 is a front elevation of the device with the cover of a housing removed.

The input shaft is indicated at 2 (FIGURES 2 and 4) and is adapted to be driven in accordance with the input variable to be recorded. Drive may be by some direct mechanical connection to a variable element the position of which is to be recorded, for example to a float for measurement of liquid levels; or if the variable gives rise to an electrical signal, e.g. for measurement of flow, pressure, temperature, humidity, or the like, the drive may be by the motor of a balancing potentiometer; or if counting is to be effected, drive may be from a ratchet mechanism advanced by pulses. The input to the shaft may thus be quite general, and, as will appear, is required to furnish very little torque, for example, less than ¼ inch-ounce. For purpose of illustration and consistency of description, it will be assumed that shaft 2 is driven in accordance with changes in position of a float movable with liquid level so that the recorder may provide records of such level. In various uses, the shaft 2 may actually be moving during the making of a record. As will appear, the elements driven by the shaft are locked for a short period during the making of a record, and hence it is desirable to provide a yieldable connection between the shaft 2 and the elements being driven of such type that during ordinary movements of limited range of the shaft 2 the shaft may rotate during a recording operation without damage to the recorder but at the same time without loss of proper indicating relationship between the shaft and the recorder. To achieve this end a yieldable clutch arrangement is provided between the shaft 2 and a driven shaft 4, the clutch arrangement comprising a disc 6 in which there is mounted a slidable pin 8 under control of a leaf spring 14, the pin being arranged to enter a notch 10 in a disc 12 secured to the shaft 4. The sloping sides of the notch 10 permit a substantial degree of relative angular movement between the shafts 2 and 4 without involving the leaving of the notch by the pin 8, so that as soon as the shaft 4 is released for movement a cam action occurs, the pin 8 moving to the bottom of the notch 10. However, if the relative movement is extensive the pin 8 may ride completely out of the notch 10 separating the two shafts for free relative movement.

Figure 2:
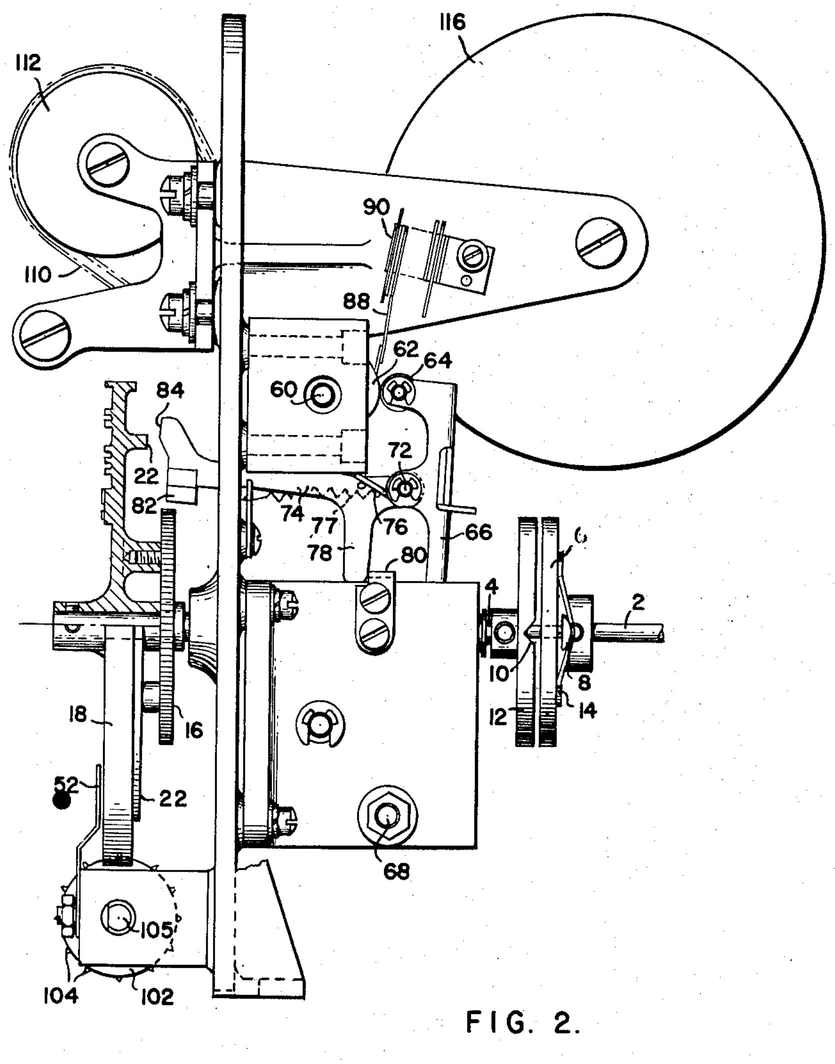
FIGURE 2 is a side elevation, partly in section, showing the assembly of the operating elements.
Figure 4:
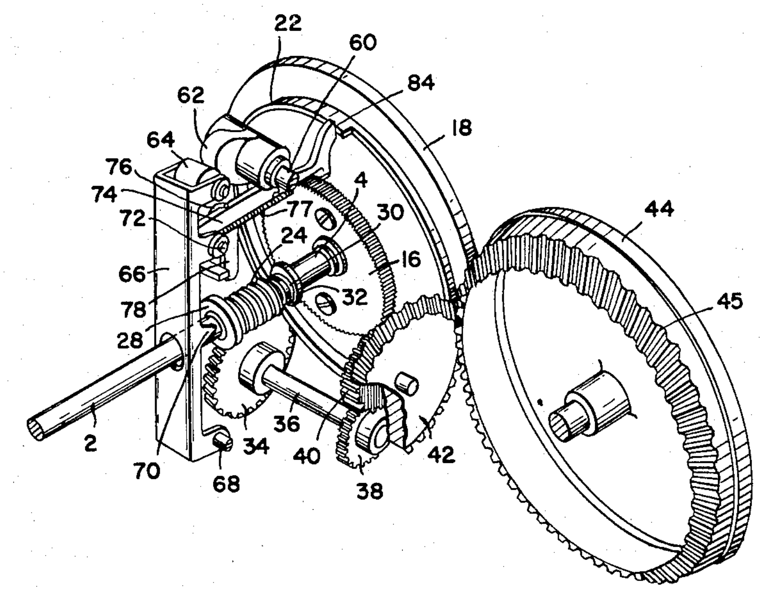
FIGURE 4 is a perspective view of the assembly.

Secured to the shaft 4 is a toothed detent disc 16, FIGURES 2 and 4, provided in the present instance with one hundred sharp edged teeth. Also secured to the shaft is a disc 18 which is provided on its front face with concentric series of arcuate coded abutment elements 20 to which further reference will be made hereafter. At the rear of the disc 18 there is sloping cam 22 extending through 360° and which at a proper circumferential point has a sudden drop from its highest to its lowest point for the purpose hereafter described.

Figure 3:
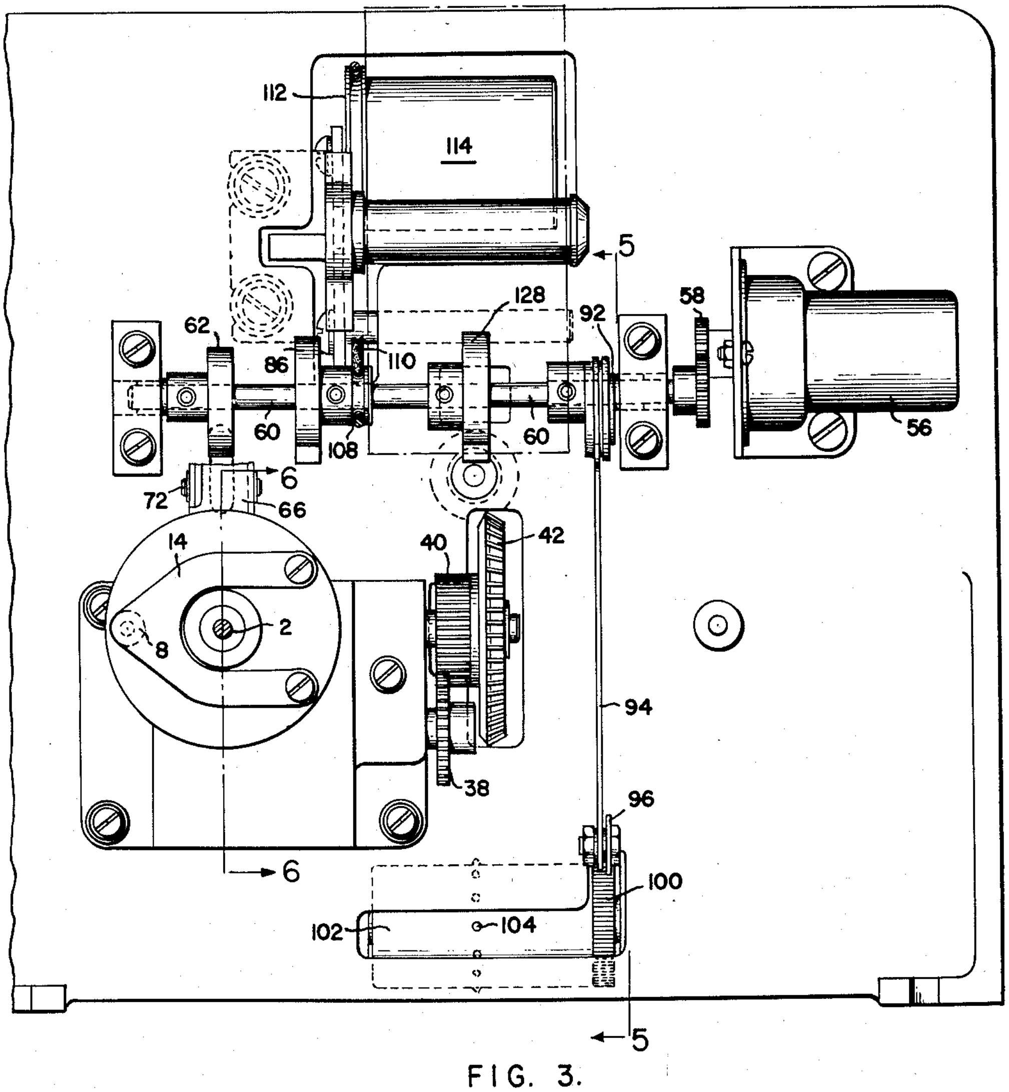
FIGURE 3 is a rear elevation of the same.
Figure 6:
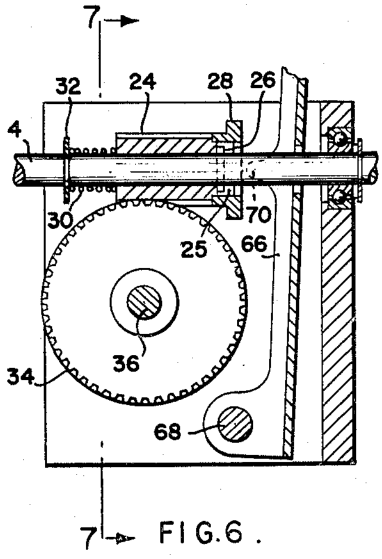
FIGURE 6 is a vertical section taken on the plane indicated at 6—6 in FIGURE 3.
Figure 7:
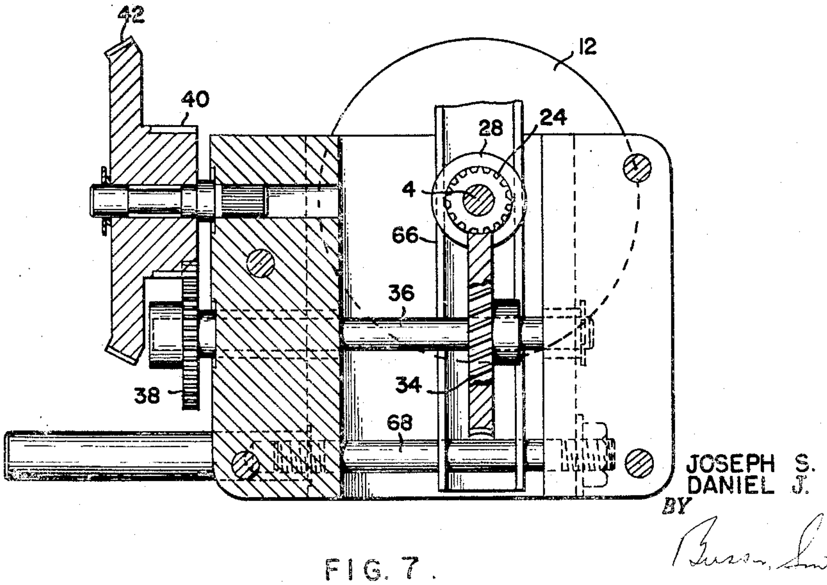
FIGURE 7 is a vertical section taken on the plane indicated at 7—7 in FIGURE 6.
Figure 8:
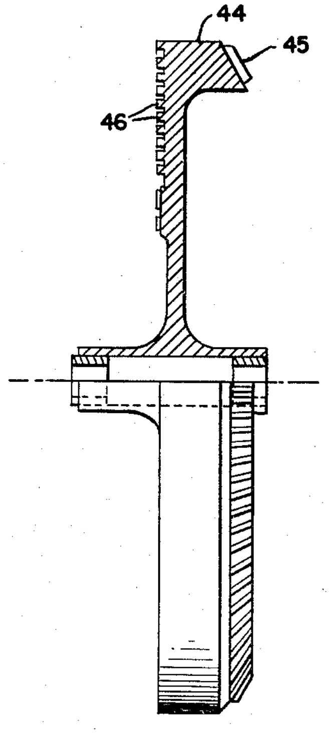
FIGURE 8 is an elevation, partly in section, showing the construction of an encoding disc for higher orders.
Figure 9:
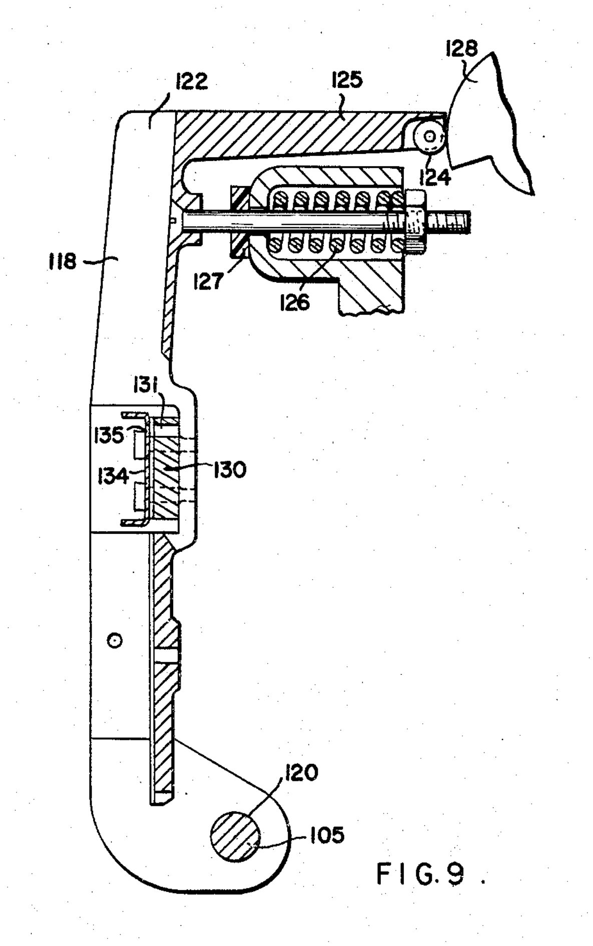
FIGURE 9 is a vertical sectional view showing details of the paper strip punching means.

The shaft 4 mounts for axial sliding movement the worm 24 (FIGURES 4, 6 and 7) which is splined to the shaft by having a transverse slot 25 therein embracing a pin 26 fixed transversely in the shaft 4. A collar 28 mounted on one end of the worm 24 is arranged to be engaged by lever 66 as hereafter described to move the worm 24 axially against the pressure of a spring 30 which engages an abutment washer 32 fixed on the shaft 4. The worm 24 has threads meshing with the teeth on a wheel 34 secured to a transverse shaft 36 which is provided with a gear 38 (FIGURES 3 and 4) meshing with the spur gear 40 on the hub of a bevel gear 42. This bevel gear meshes with the bevel teeth 45 (FIGURES 4 and 8) on a second disc 44 mounted in the supporting frame on an axis parallel to that of the disc 18. The disc 44 is provided with arcuately arranged concentric series of abutments 46 corresponding to those indicated at 20 on the disc 18.

The respective discs 18 and 44 are desirably provided with dials 48 and 50, each having 100 graduations readable against pointers 52 and 54 which are visible through a window provided in the cover of an enclosing housing which is not shown. These make possible the visual readings of indications for check or other purposes.

The various movable elements so far described are those driven by the shaft 2. As will be evident, with the provision of anti-friction bearings the elements may be driven very freely by the shaft 2 so that low input power is required.

A small motor 56 which may be battery operated has built-in reduction gearing and drives through gearing 58 a main shaft 60 which controls the recording operations of the devices. The shaft 60 carries a series of cams, of which one is indicated at 62. The cam 62 engages a follower roller 64 at the upper end of a lever 66 which is pivoted at 68 in the frame. This lever is provided with projections 70 arranged to engage the collar 28 to move the worm 24 axially. Pivoted to the lever 66 at 72 is a member 74 which is urged counterclockwise as viewed in FIGURE 2 by a spring 76 to cause its tail portion 78 to engage normally a fixed abutment 80. It may be noted that this action of the spring 76 also urges the roller 64 into contact with the cam 62 this action being augmented by another tension spring 77. The member 74 at its forward end is provided with an element 82 having a sharp lower edge adapted to engage between the sharp edged teeth of the disc 16. The member 74 also has a feeler portion 84 which, at proper times, is arranged to engage the cam 22 on the disc 18 under the action of spring 77.

Description of the structural aspects of the apparatus may be here interrupted to describe the function and operation of the lever 66 and its associated parts. When these parts are in rest position, a high portion of the cam 62 engages the roller 64 to hold lever 66 rearwardly with the result that, due to abutment of tail 78 with stop 80 the sharp edge of the element 82 is held upwardly clear of the disc 16 and with the feeler portion 84 removed from the cam 22. Thus, there is no restraint imposed on the free movement of the shaft 2 in driving the disc 18 and from it through gearing the disc 44, the gearing including the worm 24 and wheel 34. The ratio involved through the intermediate gearing is such that there is a reduction of rotation from disc 18 to disc 44 in the ratio of 100:1. In a cycle of operation, the cam 62 makes a single revolution permitting the lever 66 to rock forwardly. As it does so, the element 82 is lowered so that its sharp edge projects between teeth of the disc 16. Since both this element and the teeth on the disc have sharp edges, in general the element 82 will drop somewhere between the edges of the teeth and will exert a camming action to rotate the disc 16 and its associated parts slightly so that ultimately the lowering will cease with the element 82 nested in the lowermost portion of the interval between a pair of teeth. Even in the event that the sharp edge of element 82 engages the sharp edge of a pointed tooth, the forward sliding movement of the element 82 will cause it to drop to one side or the other of the tooth effecting a camming action which gives rise at most to an error of only one-half of the angular spacing between the teeth, the error being that of deviation of shaft 4 from the original position of shaft 2. A positive indexing of the disc 16 and its associated parts is thus assured. As the lever 66 continues to move forwardly, the feeler 84 engages the cam 22. This engagement limits the forward movement of lever 66.

As has been indicated, the cam 22 has a uniform 360° slope from a particular angular position on the disc 18 around to that same position. The result is that for any position of the disc 18 there is, at the time of abutment of feeler 84 with the cam 22, a definite position of the lever 66 when it is arrested, and by reason of engagement of its projections 70 with collar 28, a definite axial position of the worm 24 on its shaft 4. With the position of the shaft 4 fixed, by the indexing operation just described, this axial movement of the worm 24 results in a corresponding movement of the wheel 34 and, accordingly, of the disc 44. What is here involved is the following:

The discs 18 and 44 have their abutments 20 and 46 coded in a binary-decimal system which is advantageously used for securing decimal readings. This system involves the determination of each of the decimal digits of a number by means of binary coding, and to this end, reading radially outwardly, the first four circumferential series of abutments 20 of the disc 18 (considering a complete rotation of the disc 21 corresponding to unity) represent successively the binary digits 0.01, 0.02, 0.04 and 0.08, the presence of an abutment representing a unit value of the binary digit and the absence of an abutment a zero value thereof. Similarly, the next four circumferential series of abutments 20 (disregarding the continuous abutment 21 which punches holes only for alignment purposes in reading the tape) represent successively 0.1, 0.2, 0.4 and 0.8.

In the case of abutments 46 on disc 44, reading radially inwardly, the first four circumferential series of abutments represent successively 1, 2, 4 and 8, and the next four 10, 20, 40 and 80. (Continuous abutment 47 is for the punching of alignment holes.)

As will appear hereafter, these abutments are "read" radially in the sense of controlling punches, along a line joining the centers of discs 18 and 44, and their readings are visually reflected by those of the circular scales 48 and 50 against the index pointers 52 and 54.

If disc 44 was always positioned to correspond with a movement $\frac{1}{100}$ that of disc 18, it would be evident that disc 44 would continuously "creep" with respect to the reading line as disc 18 rotated, moving $\frac{1}{100}$ of a revolution for each full revolution of disc 18. Thus, in view of finite dimensions of reading pins or punches and inherent inaccuracies of parts there would be a region of ambiguity in reading; for example, what should be successive readings of 97,98,99,100,101,102 might appear either as 97,198,199,100,101,102 or 97,98,99,0,1,102, or the like. In the usual multiwheel counter a "carry" arrangement is provided so that as a units wheel moves from 9 to 0, the tens wheel is advanced one digit, the tens wheel being previously stationary. Such an expedient is undesirable in the present device for several reasons: first, the transition from 99 to 0 of the disc 18 take place in only 3.6° of angular movement making a "carry" arrangement impractical in any event; but, secondly, even if one was provided there would be required for carrying the momentary expenditure of power much in excess of that otherwise required; and, third, provisions would be necessary to prevent overrun of disc 44 and to insure accurate indexing of its new position.

Using the arrangement described, all of these difficulties are avoided. As the disc 18 moves, the disc 44 "creeps" to correspond, and the shaft 2 requires only very low input torque to drive the discs and their interconnecting gearing. When a reading is to occur, the shaft 4 is first locked by engagement of element 82 between teeth of disc 16. At most this involves an "error" displacement of disc 18 by 0.005, i.e., one-half of its least count. With shaft 4 thus locked, the worm 24 is displaced axially to the extent determined by the height of cam 22 at its point of engagement by feeler 84 to effect a corrective movement of disc 44 just compensating the amount of its "creep" beyond the position it had at the time the disc 18 was at its previous lower zero position. This corrective movement may, obviously, move the disc 44 either forwardly or backwardly to a position properly corresponding to a zero position of disc 18, the direction of slope of cam 22 and initial settings of the discs on their shafts being chosen accordingly. When the disc 18 passes from its 99 position to its 0 position, the high end of the cam 22 passes across the position of contact by feeler 84 and the cycle of corrective movement of worm 24 restarts. In other words, when the disc 18 is close to, but before its 0 position, say indicating 97 to 99, the feeler 84 moves to the low portion of cam 22 and a maximum movement is imparted to worm 24 and thence to disc 44 to cause it to move backwardly almost a full unit step, though its normal drive through the gearing has previously caused it to advance almost a full unit beyond where it should be for proper indication. But when the disc 18 moves from its 99 indication to 0 indication, the highest part of cam 22 moves into position to be engaged by feeler 84, which feeler is arrested thereby early in its forward movement to impart a minimum movement to the worm 24 so that the position of disc 44 is substantially unchanged, thus giving a correct reading. In other positions of disc 18 the height of cam 22 controls corresponding corrective shift movement of disc 44. It should be noted that the power involved to move worm 24 axially is derived from motor 56 and not from shaft 2.

While it is most convenient to provide the differential movement of disc 44 relative to disc 18 by the use of a sliding worm or helical gear as described, it will be evident that any equivalent differential gearing may be employed such as a planetary train having its differential action controlled by the position of disc 18. In fact, using low friction gearing the corrective action may be continuous by having, for example, a helical or worm gear adjusted continuously by a follower engaged by a cam such as 22. But it is most advantageous to avoid all unnecessary loading of shaft 2 and hence corrective action produced by an independent source of power is desirable.

A second cam 86 on the shaft 60 is arranged to control a contact 88 on a switch arrangement 90 to interrupt drive by the motor 56 upon completion of a single revolution of shaft 60 for each operation thereof. Such a means for securing a single revolution of a shaft is well known, and details of circuitry involved need not be described. It will suffice to state that the motor 56 is started by a switching impulse which may be derived from a remote source or from a local clock mechanism, and when started will cause a single revolution of shaft 60 and then come to rest. The intermittent type of operation under clock control may be particularly cited to illustrate the advantages of this device. In a remote location for the recording of water level, for example, readings at fifteen minute intervals may be made during a period of over a year under clock switching control using only a six volt battery for driving motor 56, a reading cycle typically requiring only 12 seconds.

An eccentric 92 carried by the shaft 60 drives a link 94 to oscillate an arm 96 carrying a pawl 98 to advance step by step a ratchet 100 carried by a drum 102 provided with pins 104 for feeding a strip of paper which is punched to produce records. A spring detent 106 is provided to prevent retrograde movement of the drum 102.

A pulley 108 carried by the shaft 60 drives through a belt 110 a pulley 112 connected to a spindle which takes up the record strip as a roll 114, a supply roll 116 being provided from which the record strip is fed to the feed drum 102. The drive of the takeup roll operates it at a rate exceeding the feed by the drum 102, the belt slipping to maintain the strip under tension.

A rocking frame 118 is pivoted on the shaft 105 as indicated at 120 and serves as a mounting for the punch and electrical read out arrangement as will be described. A paper guide channel 122 is provided in the frame 118. A horizontally extending arm 125 of the frame 118 carries a roller 124 which acts as a follower for the cam 128 secured to the shaft 60. Rocking movements are imparted to the frame by this cam, the frame roller being held against the cam by a spring 126. A resilient abutment washer 127 limits movement of the frame 118 as the roller and end of arm 125 leave the high point of cam 128.

A punch carrier 130 is mounted in the frame 118 and is provided with guide openings 131 in which punches 132 are arranged for sliding movement. A die 134 provided with openings 135 for the various punches is spaced slightly from the punch carrier 130 to provide a channel for the passage of the record strip. One punch is provided for each of the digit channels and is in alignment with a corresponding series of abutments along the line joining the centers of the discs 18 and 44. Additionally, there are punches for alignment openings aligned with the abutments 21 and 47, these punches being of smaller diameter at their punching ends than the punches for the holes representing digits. Each of the digit punches is provided with an upper abutment 136 and a lower abutment 138, these being provided by flats which are formed on the punches, one pair of flats forming an extended stem 140 which has a vertical extent limited so as not to exceed one-one-hundredth of the circumferential extent of its corresponding series of abutments.

A punch retracting abutment is provided as indicated at 142 serving to engage abutments 136 to withdraw the active ends of the punches from the path of the record strip as the frame 118 moves forwardly. Each of the punches is associated with a contact leaf 144 engageable with its abutment 138, these leaves being arranged to make electrical contact with buttons 146 carried by an insulating plate 147, contacts being made corresponding to the punches which are active. The plate 147 has printed circuit leads 149. By the use of wiring in obvious fashion signals may thus be transmitted to a remote location for telemetering purposes. It may be here noted that if telemetering alone is desired the punches may be considered merely as switch actuating pins serving to close the telemetering connections. These connections may run to automatic printers, remote punching devices, or the like as may be desired, or more simply, may merely serve to operate neon lights or the like for display purposes.

Figures 10, 11:
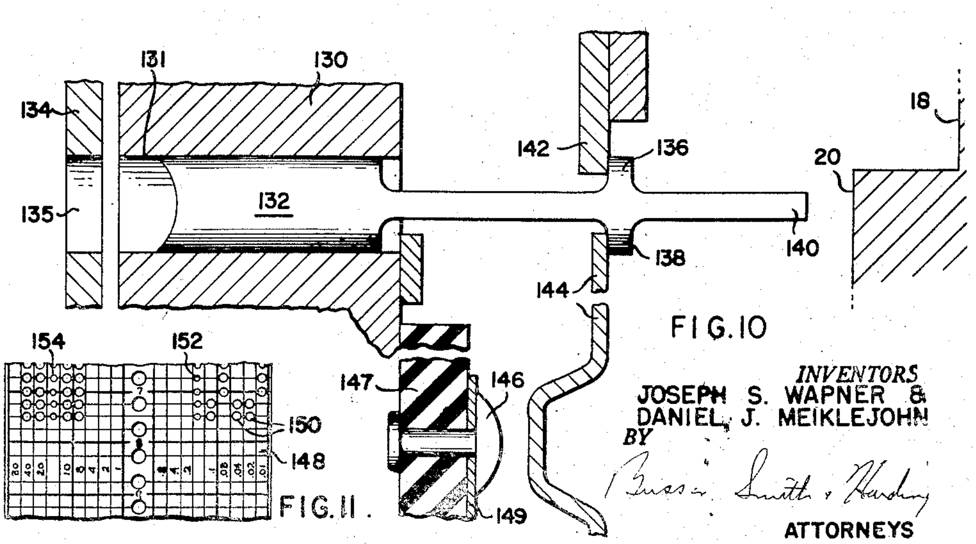
FIGURE 10 is an enlarged sectional view showing the assembly of a punch and its associated parts.
FIGURE 11 is a fragmentary elevation of a record strip of the type formed by the recorder.

The record sheet typically used is shown at 148 in FIGURE 11. When the recorder is at rest the record sheet 148 has a blank region in in line with the punches, this resulting from a feed at the end of a preceding cycle of operation. During the single revolution imparted to the shaft 60 for a cycle, rocking movement is first imparted to the lever 66 to effect indexing of the toothed disc 16 followed by the adjusting of the disc 44 as previously described in detail. During this operation the frame 118 is in its forward position, the punches 132 being held spaced from the record strip and also spaced from their cooperating abutments. After the position of the disc 44 is adjusted, and while the disc 18 remains locked in position, the cam 128 releases the roller 124 with the result that under the action of the spring 126 the frame 118 rocks rearwardly. As a result of this action, those punches which are in line with abutments are restrained while those which are not in line with abutments may move with the frame 118. Those which are restrained are, in effect, driven through the record strip to provide punched openings therein.

Figure 5:
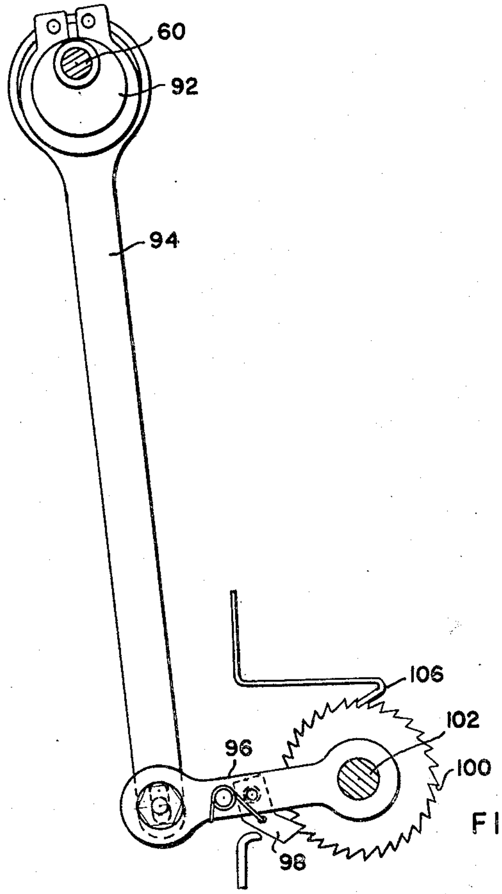
FIGURE 5 is a sectional view taken on the plane indicated at 5—5 in FIGURE 3 and showing particularly the driving means for a paper strip into which the record is punched.

The cycle is terminated by concurrent forward rocking of the frame 118 and release of the discs by rearward movement of the lever 66, these actions being followed by the imparting of a step of advance to the record strip by the pawl and ratchet mechanism shown in FIGURE 5. At the end of the cycle the switch at 88 is opened bringing the motor 56 to rest awaiting the next impulse which may start another similar cycle of operation.

Referring to FIGURE 11, the strip 148 is shown as provided with rulings defining the various channels together with imprintings to indicate the values of the channels so that, if desired, the ultimate record may be visually read. The punched openings indicative of digital values are indicated at 150, while at 152 and 154 there are illustrated the alignment openings which are of smaller size and which are useful in insuring proper alignment of the record strip in a translating device which may be used to secure printed records or to control the punching of cards or other recording as may be desired.

It will be obvious from the foregoing that there is provided an extremely versatile recorder requiring extremely low input, power and torque for its operation and also requiring very little operating power for carrying out the drives necessary for a recording operation. As has been discussed in detail there is complete elimination of ambiguity in the output despite the extended range of recording and indication which is involved.

It will be obvious that various changes in details of construction and operation may be made without departing from the invention as defined in the following claims.

What is claimed is:

1. In combination, a movable member arranged to be variably positioned in accordance with an input to be measured, a first member driven by said movable member and carrying a plurality of digitally coded concentrically arranged series of abutments, a second member carrying another plurality of digitally coded concentrically arranged series of abutments, said first and second members being mounted on parallel axes and presenting their abutments in the same common plane transverse to said axes and in close side by side proximity to each other, a plurality of elements, each arranged for engagement with abutments of one of said series, said abutments being brought selectively into alignment with said elements by movements of said movable member, a carrier mounting said elements and movable to bring said elements simultaneously into engagement with any of said abutments aligned therewith, means for so moving said carrier, connecting means through which said movable member normally drives said second member at a substantially slower rate than said first member but at a definite ratio thereto, said connecting means including means arranged to receive an input motion in addition to that from said movable member and thereupon impart a corrective shift movement to said second member relative to said first member, and means responsive to the position of the first member to provide said input motion to produce a corrective shift movement variable with the position of the first member to avoid ambiguity of positions of the digitally coded series of abutments of the second member, the last mentioned means operating to provide said input motion only in conjunction with movements of said carrier which cause said elements to engage abutments.

2. The combination of claim 1 including means for guiding a record strip closely adjacent to all of said elements, said elements constituting punches, and means cooperating with said elements to produce perforations in said strip in accordance with relationships of said elements with said abutments.

3. The combination of claim 1 including electrical contacts operated by said elements in accordance with relationships of said elements with said abutments.

4. The combination of claim 1 including means for arresting movement of said first member at the time of actuation of said means for moving the carrier.

5. The combination of claim 1 including sequence controlling means for first effecting actuation of said corrective shift imparting means and then movement of said carrier to bring said elements into engagement with abutments.

References Cited in the file of this patent

UNITED STATES PATENTS

| | | |
|---|---|---|
| 122,098 | Anderson | Dec. 26, 1871 |
| 779,153 | Franke et al. | Jan. 3, 1905 |
| 2,647,580 | Connolly | Aug. 4, 1953 |
| 2,705,105 | Paschen | Mar. 29, 1955 |
| 2,803,448 | Biebel | Aug. 20, 1957 |
| 2,826,252 | Dickstein | Mar. 11, 1958 |
| 2,867,796 | Kendall | Jan. 6, 1959 |
| 2,869,782 | Leonard | Jan. 20, 1959 |
| 2,888,673 | Layton | May 26, 1959 |
| 2,901,041 | Barbeau et al. | Aug. 25, 1959 |
| 2,935,249 | Roth | May 3, 1960 |
| 2,948,463 | Yeasting | Aug. 9, 1960 |
| 2,961,647 | Dzaack | Nov. 22, 1960 |